Dec. 3, 1963 R. A. WOOD 3,113,250
TRANSISTOR CONTROL CIRCUIT
Filed July 28, 1960
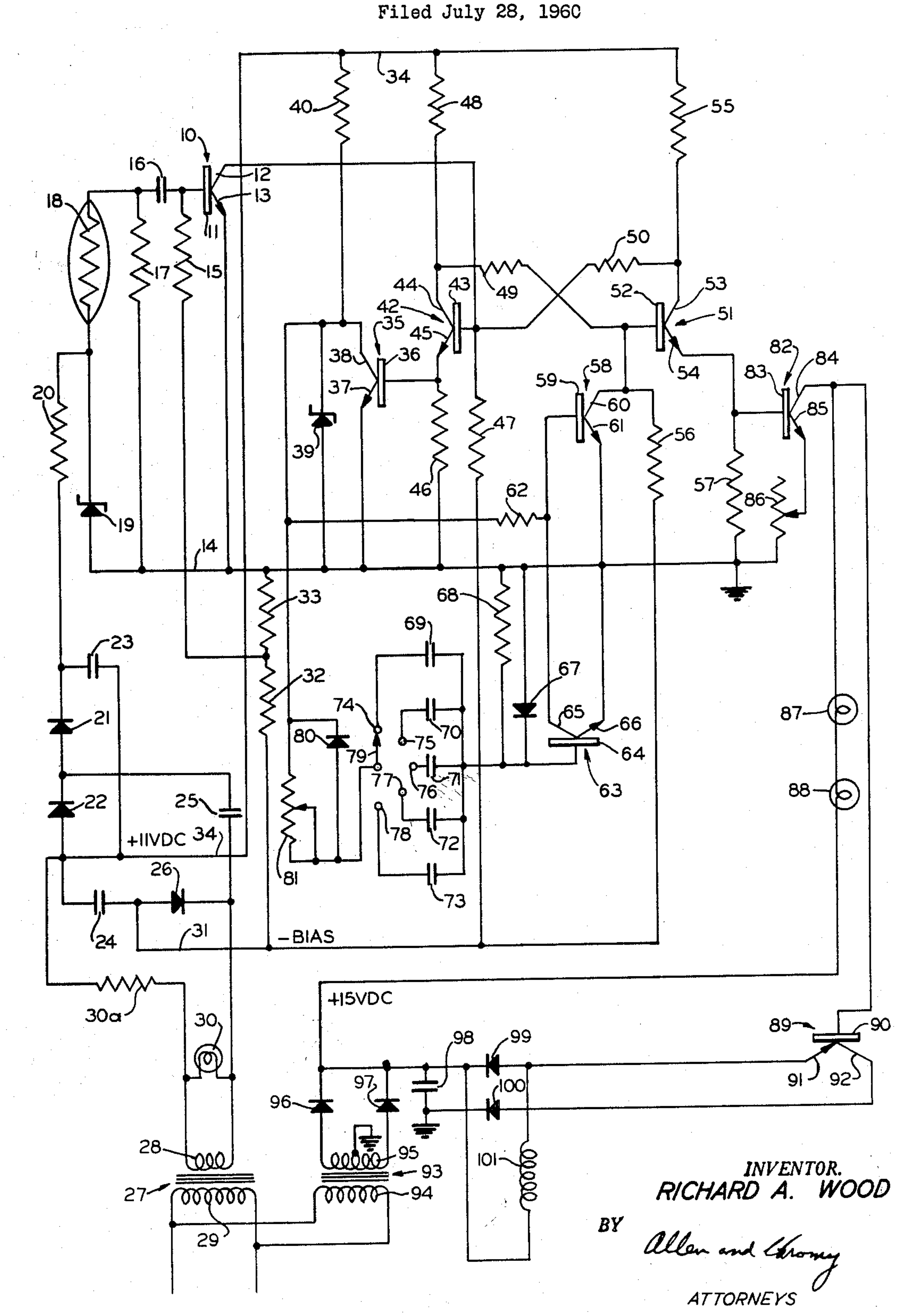
INVENTOR.
RICHARD A. WOOD
BY Allen and Chromey
ATTORNEYS United States Patent Office 3,113,250

Patented Dec. 3, 1963

3,113,250

TRANSISTOR CONTROL CIRCUIT

Richard A. Wood, Sunnyvale, Calif., assignor, by mesne assignments, to Morton Salt Company, Chicago, Ill., a corporation of Illinois Filed July 28, 1960, Ser. No. 46,015
9 Claims. (Cl. 317—148.5)

This invention relates to an electrical control circuit employing semi-conductor devices. More particularly this invention relates to control circuits employing semi-conductor devices for electrically timing various operations.

An object of this invention is to provide an improved control circuit employing semi-conductor devices with high stability.

Another object of this invention is to provide an improved electrical timer of very compact construction.

Another object of this invention is to provide an improved electrical timer employing semi-conductor devices in which regulating devices are employed to improve the stability and reliability of the unit.

Still another object of this invention is to provide an improved electrical timer employing semi-conductor devices connected so that compensation is provided for the effect of temperature rise therein.

Still another object of this invention is to provide an improved electrical timer employing semi-conductor devices, said timer being constructed to provide highly stable and reliable operation timing of the energization of a solenoid or other electrical or mechanical device.

A further object of this invention is to provide a transistor circuit that is connected to control the charging of a capacitor for the purpose of timing the operation of a mechanical device for another electrical circuit.

Other and further objects of this invention will be apparent to those skilled in the art to which it relates from the following specification, claims and drawing.

In accordance with this invention there is provided an electrical circuit which employs a plurality of transistor type of semi-conductor devices for the purpose of providing a timing control. This circuit employs a transistor the conductivity of which is controlled by means of a light sensitive cell or other type of switching arrangement. This transistor is connected to control the conductivity of a normally conductive transistor which is connected as one leg or side of a flip flop whereby, when this normally conductive transistor is cut off or rendered non-conductive, the transistor forming the other leg of the flip flop becomes conductive and saturates. This operation controls a driver transistor that in turn drives a power transistor connected to control the energization of a solenoid device that may be employed to control another circuit or perform a desired mechanical operation which is to be timed.

The timing of the operation is arranged to be controlled by the charging of a storage device such as a capacitor which is connected through a resistor to the regulated voltage which is also applied to the collector electrode of one of the transistors and the charging of this capacitor is initiated when this transistor is rendered non-conductive. The rate of charging may be controlled by a variable resistor and capacitors of different values may be selected by means of a switch. Also a fixed resistor connected in series with this capacitor is arranged to provide the operating bias potential for the base of another transistor so that this latter transistor is rendered conductive thereby and it in turn controls the conductivity or bias potential of a still further transistor which in turn is arranged to control the bias potential of the base of the transistor forming the second leg of the flip flop.

When the capacitor is charged, the voltage drop across the fixed resistor drops to a point where it is no longer sufficient to furnish the desired bias for the first auxiliary transistor associated therewith. As a result the transistor connected across the bias resistor of the transistor forming the second leg of the flip flop is rendered non-conductive and the first transistor of the flip flop circuit becomes conductive and saturates. The capacitor is then rapidly discharged through a pair of diodes that are connected in series therewith and through the transistor the base bias of which is controlled by the first flip flop transistor. At this time also the output power transistor is cut off since drive thereto is interrupted and the solenoid connected thereto is de-energized.

The circuit is then ready for the next cycle of operation and this is initiated as before by applying a voltage control signal to the first transistor.

Further details of this invention will be set forth in the following specification, claims and in the drawing in which briefly the sole figure is a schematic wiring diagram of an embodiment of this invention.

Referring to the drawing in detail, reference numeral 10 designates a transistor having a base 11, a collector 12 and an emitter 13 and the base thereof is connected to the upper terminal of the resistor 15 and to the right hand terminal of the capacitor 16, the left hand terminal of which is connected to the upper terminal of the resistor 17 and to the upper terminal of the light sensitive cell 18. A light source 30 is associated with the light sensitive cell 18 and articles may be passed between the light source and the cell 18 to interrupt the light beam to the cell and set up voltage pulses in the output circuit thereof. A suitable switch may be substituted for the cell 18 if desired and in this case the articles conveyed past the cell would close and open the switch to produce the pulses to be applied to the base 11 of the transistor 10. The lower terminal of the light sensitive cell 18 is connected to the upper terminal of the resistor 20 and the zener diode 19 which functions as a voltage regulator.

The emitter 13 of the transistor 10 is connected to the grounded line 14 which may be the metal chassis of the apparatus. The lower terminal of the resistor 17 and zener diode 19 are also connected to the ground line 14. The lower terminal of the resistor 20 is connected to the left hand terminal of the capacitor 23 and to the cathode of the diode 21 forming the positive terminal of the power supply. The anode of this diode is connected to the cathode of the diode 22 and to the upper terminal of the capacitor 25 and the anode of the diode 22 is connected to the left hand terminal of the secondary 28 of the transformer 27 and to the other terminal of the capacitor 23 as well as to the plus 11 volt D.C. line 34 which supplies D.C. potential to the upper terminals of the resistors 40, 48 and 55, the lower terminals of which are connected to the collectors 38, 44 and 53, respectively, of the transistors 35, 42 and 51, respectively.

The other side of the secondary winding 28 is connected to the cathode of the diode 26 and to the lower terminal of the capacitor 25. The right-hand terminal of the capacitor 24 is connected to the anode of the diode 26, the cathode of which is connected to the secondary of the transformer 28. Thus these diodes 21, 22 and 26 and capacitors 23, 24 and 25 are connected into a voltage tripler circuit.

The negative bias line 31 is connected to the common terminals of the capacitor 24 and the anode of diode 26 and this line is also connected to the lower terminals of the resistors 32, 47 and 56. The upper terminal of the resistor 32 is connected to the lower terminals of the resistors 15 and 33 and the upper terminal of the resistor 33 is connected to the ground line 14. The upper terminal of the resistor 47 is connected to the base 43 of the transistor 42 and to the collector 12 of the transistor 10 and also to the left hand terminal of resistor 50. The upper terminal of the resistor 56 is connected to the collector 60 of the transistor 58 and to the base 52 of the transistor 51 and also to the right hand terminal of the resistor 49.

The lower terminals of the resistors 40 and 48 are connected to the collectors 38 and 44 of the transistors 35 and 42, respectively. The lower terminal of the resistor 40 is also connected to the upper terminal of the zener diode 39, the anode of which is connected to the ground line 14. The collector of the transistor 35 is also connected to the upper terminal of the variable resistor 81 to the cathode of the diode 80 and to the left hand terminal of the thermistor 62. The right-hand terminal of this resistor is connected to the base of the transistor 58 and to the collector of the transistor 65. The emitters 61 and 66 of the transistors 58 and 63 are connected to the ground line 14. The lower terminal of the variable resistor 81, the anode of the diode 80, are connected together to the contactor 79 which is associated with the contacts 74, 75, 76, 77 and 78 which are connected to the left hand terminals of the capacitors 69, 70, 71, 72 and 73, respectively, whereby different ones of these capacitors may be selected by this contactor 79. The right hand terminals of these capacitors 69, 70, 71, 72 and 73 are connected together and to the lower terminals of the resistor 68, the cathode of the diode 67 and to the base 64 of the transistor 63. The upper terminal of the resistor 68 and the anode of the diode 67 are connected to the ground line 14.

The emitters 45 and 54 of the flip flop transistors 42 and 51 are connected to the upper terminals 46 and 57, respectively, of the resistors 46 and 57, respectively, the lower terminals of which are connected to the ground line 14. The collector of the transistor 42 is also connected through the resistor 49 to the base 52 of the transistor 51 and the collector 53 of the transistor 51 is connected through the resistor 50 to the base 43 of the transistor 42. The emitter 54 of the transistor 51 is also connected to the base 83 of the transistor 82. The emitter of the latter transistor is connected through the variable resistor 86 to the ground line 14. The collector 84 of the transistor 82 is connected to the base 90 of the power transistor 89 and to the upper terminal of the series connected lamps 87 and 88, the lower terminal of which is connected to the cathode of the rectifier 96, the anode of which is connected to one side of the secondary 95 of the transformer 93. The center tap of this secondary is connected to ground and the other side of this secondary is connected to the anode of the diode 97, the cathode of which is connected to the cathode of the diode 96 and to the upper terminal of the filter capacitor 98. The lower terminal of this filter capacitor is connected to ground and to the cathode of the diode 100, the anode of which is connected to the collector 92 of the transistor 89. The emitter 91 of the transistor 89 is connected to the upper terminal of the solenoid 101 and the lower terminal of this solenoid is connected to the upper terminal of the capacitor 98 and to the cathodes of the diodes 96 and 97.

The operation of this apparatus is as follows: When a can or similar article passes between the lamp 30 and the light-sensitive cell 18 it interrupts the light beam and after the passage of this article the light beam is restored, thereby producing a pulse which passes through the capacitor 16 and is applied to the base 11 of the transistor 10. Normally this base is biased negatively through the resistor 15 so that leakage through this transistor—for example, leakage caused by temperature rise—may be kept down. This negative bias is overcome by the positive pulse and the transistor 10 saturates. Transistor 42 of the flip flop employing transistors 42 and 51 is normally saturated and the base 43 thereof is supplied with a positive bias through the circuit including the resistors 47, 50 and 55. However, when the transistor 10 saturates it provides a low impedance shunt circuit across the resistor 47 to the ground line 14 and this circuit reduces the positive bias of the base 43 so that the transistor 42 cuts off and the transistor 51 saturates, since the base 52 of transistor 51 becomes positively biased as a result of the reduced current flowing through the resistor 48 and consequently the voltage drop across this resistor is reduced. Thus positive bias is supplied to the base 52 through the resistors 48 and 49.

As long as transistor 42 was saturated, transistor 35 was likewise saturated because the current flow through the resistor 46 provided a positive bias to the base 36 of the transistor 35. However, when transistor 42 was turned off, this resulted in removal of the positive bias from the base 36 and transistor 35 was also turned off. When the transistor 35 was turned off the voltage across the zener diode 39 went up to the regulated voltage, which in this case is 8.2 volts, and the capacitor 69 which is connected to the switch 79 started charging at this regulated voltage through resistors 68 and 81. The charging current of this capacitor passes through the resistor 68 and the voltage drop across this resistor provides a positive bias for the base 64 of the transistor 63. The various capacitors 69, 70, 71, 72 and 73 are of different sizes so that they require different charging intervals. Thus different time intervals may be selected by adjusting the switch 79 to connect different ones of these capacitors into the charging circuit. The charging interval also may be varied by varying the resistor 81.

As long as the selected capacitor is charging, current flows through the resistor 68 and provides a bias for the base 64 of the transistor 63, and as long as this bias is maintained the transistor 63 is saturated and keeps the base 59 of transistor 58 at cut off potential.

The collector 65 of transistor 63 is connected by means of the temperature-sensitive resistor 62 of the thermistor type to the zener diode 39. The thermistor 62 compensates for timing changes due to temperature variations and this thermistor resistance varies from 75,000 ohms at 30° C. to 1200 ohms at 130° C.

As long as transistor 51 of the flip flop is saturated, a positive bias is provided to the base 83 of transistor 82 so that this transistor is saturated and as long as transistor 82 is saturated it provides drive to the transistor 89 which is of the PNP type. As long as transistor 89 is driven, it functions to energize the solenoid 101 which is connected in series with the emitter 91 thereof and the positive output of rectifiers 96 and 97.

When transistor 63 is cut off, that is, when the capacitor becomes charged and the voltage drop across resistor 68 drops substantially toward zero, it no longer functions to reduce the potential of the base 59 of transistor 58 and as a result this transistor saturates and thereby functions to reduce the potential of the base 52 of transistor 51. When transistor 51 cuts off the potential of the base 43 of transistor 42 goes up since the voltage drop across resistor 55 is reduced and transistor 42 saturates. As a result the bias on the base 36 of the transistor 35 goes up and this transistor saturates. When transistor 35 saturates, the charged capacitor of the group 69—73 is discharged rapidly through diodes 67 and 80 and through this transistor.

When the transistor 51 of the flip flop was cut off and transistor 42 saturated, the bias of the base 83 of transistor 82 was reduced with the result that drive provided by transistor 82 was removed from transistor 89 and this transistor cut off so that the current through the solenoid 101 was interrupted or substantially reduced. The counter-electromotive force generated in this solenoid by the collapsing magnetic field thereof is shorted by the diode 99 which is polarized to provide a low impedance path for this counter E.M.F., thereby preventing large counter E.M.F.'s from building up on the terminals of this solenoid.

Another diode 100 is connected between the collector 92 of transistor 89 and ground, and the function of this diode is to raise the voltage of the collector 92. This helps to stop leakage current through the transistor 89 and it also functions to increase the current through transistor 82. The lamps 87 and 88 are provided to furnish back bias on the base 90 of transistor 89 when this transistor is cut off. Inasmuch as these lamps are in series with the positive supply and the collector 84 of transistor 82, the current drawn by this transistor passes through these lamps and causes them to heat up to incandescence, with the result that the resistance thereof increases so that the current through the transistor 82 is kept down to safe limits. However, when transistor 82 is cut off the resistances of these lamps 87 and 88 are reduced to their cold values with the result that the 15 volt back bias is applied to the base 90 of transistor 89 when this transistor is cut off.

While I have shown a preferred embodiment of the invention it will be understood that the invention is capable of variation and modification from the form shown so that its scope should be limited only by the scope of the claims appended hereto.

What I claim is:

1. A transistor timing control circuit comprising a pair of transistors, means for connecting said transistors so that they are electrically conductive alternately and a predetermined one thereof is initially conductive when the circuit is energized, a third transistor connected to said initially conductive transistor to be controlled thereby, a storage device, a solenoid, means for energizing said solenoid when the other of said pair of transistors becomes conductive, means for connecting said storage device substantially in parallel to said third transistor whereby said capacitor becomes charged when said third transistor is non-conductive, means for reducing the conductivity of the other of said pair of transistors when said storage device is charged so that the initially conductive one of said pair of transistors again becomes conductive, said solenoid energizing means also including means for interrupting the energization of said solenoid when said storage device is charged, and means for discharging said storage device when said initially conductive transistor becomes conductive.

2. A transistor timing control circuit comprising a pair of transistors, means for connecting said transistors so that they are electrically conductive alternately and a predetermined one thereof is initially conductive when the circuit is energized, each of said transistors having a collector electrode, an emitter electrode, and a base electrode, a third transistor also having a collector electrode, an emitter electrode and a base electrode, means for connecting the collector electrodes of said transistors to a source of current supply, means for connecting the base of said third transistor to the emitter of said initially conductive transistor to supply a bias thereto whereby said third transistor is also conductive, a storage device, a solenoid, means for energizing said solenoid when the other of said pair of transistors becomes conductive, means for connecting said storage device substantially in parallel to said third transistor whereby said capacitor becomes charged when said third transistor is non-conductive, means for reducing the conductivity of the other of said pair of transistors when said storage device is charged so that the initially conductive one of said pair of transistors again becomes conductive, said solenoid energizing means also including means for interrupting the energization of said solenoid when said storage device is charged, and means for discharging said storage device through said third transistor when said initially conductive transistor and said third transistor again become conductive.

3. A transistor timing control circuit as set forth in claim 1 further comprising means for connecting said pair of transistors into a flip-flop circuit in which a first one of said transistors is initially conductive and the second one thereof is initially non-conductive, and means connected to the emitter of said first transistor for controlling the bias potential of the base of said third transistor.

4. A transistor timing control as set forth in claim 1 further characterized in that said solenoid energizing means includes a transistor with variable impedance means for automatically limiting the collector current therethrough.

5. A transistor control circuit comprising a pair of transistors, means for connecting said transistors so that they are electrically conductive alternately and a predetermined one thereof is initially conductive when the circuit is energized, signal responsive means connected to control the voltage bias of an electrode of the initially conductive transistor so that the other of said pair of transistors is rendered conductive when said signal responsive means receives a signal, a storage device, means for initiating the charging of said storage device when said initially conductive transistor is rendered non-conductive, means for reducing the conductivity of the other of said pair of transistors when said storage device is charged so that the initially conductive one of said pair of transistors again becomes conductive, a device to be controlled, means including an output transistor for energizing said last mentioned device while said storage device is charging, said last mentioned means also including a drive transistor for said output transistor and variable impedance means the impedance of which is variable in response to the current through said drive transistor to prevent overload thereof, and means for discharging said storage device when said initially conductive transistor becomes conductive.

6. A transistor timing control circuit as set forth in claim 5 further characterized in that the means for discharging said storage device comprises an additional transistor connected to be controlled by said initially conductive transistor.

7. A transistor timing control circuit as set forth in claim 5 further characterized in that said variable impedance means comprises a lamp having a low cold impedance and a substantially higher impedance when heated to incandescence.

8. A transistor timing control circuit as set forth in claim 5 further characterized in that said variable impedance means is connected to the base of said output transistor to provide back bias thereto when said drive transistor is cut off.

9. A transistor timing control circuit as set forth in claim 5 further characterized in that said variable impedance means is connected between a source of current supply and the collector of said drive transistor and the base of said output transistor, said variable impedance means also comprising a resistance device having a low resistance when said drive transistor is cut off and having a materially higher resistance when said drive transistor is saturated.

References Cited in the file of this patent

UNITED STATES PATENTS

| | | |
|---|---|---|
| 2,875,382 | Sandin et al. | Feb. 24, 1959 |
| 2,949,582 | Silliman | Aug. 16, 1960 |
| 2,959,717 | Conger | Nov. 8, 1960 |
| 2,970,228 | White et al. | Jan. 31, 1961 |
| 3,005,935 | Wood | Oct. 24, 1961 |